(12) United States Patent
Yoneda et al.

(10) Patent No.: US 7,041,766 B2
(45) Date of Patent: May 9, 2006

(54) COLORLESS AND TRANSPARENT POLYIMIDESILICONE RESIN HAVING THERMOSETTING FUNCTIONAL GROUPS

(75) Inventors: Yoshinori Yoneda, Usui-gun (JP); Michihiro Sugo, Usui-gun (JP); Hideto Kato, Nakakubiki-gun (JP)

(73) Assignee: Shin-Etsu Chemical Co., LTD, Tokyo (JP)

( * ) Notice: Subject to any disclaimer, the term of this patent is extended or adjusted under 35 U.S.C. 154(b) by 0 days.

(21) Appl. No.: 10/681,119

(22) Filed: Oct. 9, 2003

(65) Prior Publication Data

US 2004/0072982 A1    Apr. 15, 2004

(30) Foreign Application Priority Data

Oct. 10, 2002    (JP) ............................. 2002-297358

(51) Int. Cl.
 *C08G 77/26*    (2006.01)

(52) U.S. Cl. .......................... 528/26; 528/38; 528/28; 528/29

(58) Field of Classification Search ................ 528/28, 528/26, 29, 38
See application file for complete search history.

(56) References Cited

U.S. PATENT DOCUMENTS

| | | | |
|---|---|---|---|
| 4,586,997 A | 5/1986 | Lee | |
| 4,670,497 A | 6/1987 | Lee | |
| 4,701,511 A | 10/1987 | Valenty | |
| 4,853,452 A | 8/1989 | Lee | |
| 5,340,684 A * | 8/1994 | Hayase et al. | 430/166 |
| 5,643,986 A * | 7/1997 | Ishikawa et al. | 524/366 |
| 6,461,738 B1 * | 10/2002 | Ishikawa et al. | 428/447 |
| 6,872,457 B1 * | 3/2005 | Yamaguchi et al. | 428/447 |

FOREIGN PATENT DOCUMENTS

| | | |
|---|---|---|
| EP | 0 634 673 A1 | 1/1995 |
| EP | 0 725 302 A2 | 8/1996 |
| EP | 1 091 371 A2 | 4/2001 |
| JP | 61-83228 A | 4/1986 |
| JP | 61-118424 A | 6/1986 |
| JP | 61-118425 A | 6/1986 |
| JP | 2-36232 A | 2/1990 |
| JP | 10-195278 A | 7/1998 |

* cited by examiner

*Primary Examiner*—Margaret G. Moore
(74) *Attorney, Agent, or Firm*—Birch Stewart Kolasch & Birch LLP

(57) ABSTRACT

A colorless and transparent thermosetting polyimidesilicone resin comprising structural units of the following general formula (1) and structural units of the general formula (4), said resin being soluble in an organic solvent

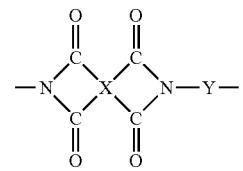

(1)

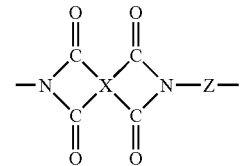

(4)

wherein X is a tetravalent organic group having 4 or more carbon atoms, none of the carbon atoms of X being bound to a plurality of carbonyl groups, Y is a diamine residue and Z is a diaminosiloxane residue.

7 Claims, 2 Drawing Sheets

COLORLESS AND TRANSPARENT POLYIMIDESILICONE RESIN HAVING THERMOSETTING FUNCTIONAL GROUPS

This Nonprovisional application claims priority under 35 U.S.C. § 119(a) on Patent Application No. 2002-297358 filed in JAPAN on Oct. 10, 2002, the entire contents of which is hereby incorporated by reference.

FIELD OF THE INVENTION

This invention relates to a thermosetting resin, particularly to a polyimide resin having thermosetting functional groups which give a cured film with excellent heat resistance, mechanical strength, solvent resistance, and adhesion to a various kinds of substrates by heating at a low temperature for a short period of time. In addition, the resin is highly transparent in the visible light region and soluble in solvents.

DESCRIPTION OF THE PRIOR ART

A polyimide resin is widely used as a resin varnish for electronic parts etc., because it is excellent in heat resistance and electric insulation. However, the polyimide resin dissolves only in a limited number of organic solvents having high boiling points. Therefore, generally, a polyamic acid which is a polyimide precursor and relatively easily soluble in various kinds of organic solvents is applied on a substrate and, then, heated at 300 degrees C. or higher for a long period of time to dehydrate into a polyimide. This dehydration of the polyamic acid to a polyimide requires a long time of heating at a high temperature, which tends to degrade the substrate. If the heating is not enough, a portion of the polyamic acid remains in the resulting resin, making the resin less moisture resistant and corrosion resistant.

A method is known in which a polyimide resin film is made by applying a solution of an organic-solvent soluble polyimide resin, instead of a polyamic acid, on a substrate and heating it to evaporate the solvent (see, e.g., Japanese Patent Application Laid-open No. 61-83228, No.61-118424, No.61-118425, and No.02-36232.) However, the films obtained from these polyimide resins soluble in an organic solvent have poor solvent resistance. Japanese Patent Application Laid-open No. 10-195278 describes a thermosetting polyimide resin composition which is to be cured by heating at a relatively low temperature for a short period of time to form a polyimide resin film with a good adhesion property and solvent resistance.

Meanwhile, the polyimide resins have color, which limits their applications, although they have excellent physical properties. For this reason, a transparent and colorless polyimide has been strongly desired. At present, transparent polyimide resins are used for alignment layers for liquid crystals and so on. However, all of them are thermoplastic and do not have good heat resistance.

SUMMARY OF THE INVENTION

An object of the present invention is to provide a polyimidesilicone resin having thermosetting functional groups which give a cured film with excellent heat resistance, mechanical strength, solvent resistance, and adhesion to a various kinds of substrates by heating at a low temperature for a short period of time. The resin has no color and an excellent transparency in the visible light region of from 400 nm to 700 nm and solubility in solvents.

As a result of extensive researches, the inventors have found that the above object can be attained by introducing specific molecular structures in a polyimide resin. Thus, the present invention provides a colorless and transparent thermosetting polyimidesilicone resin and a method of producing the same, which resin comprises structural units of the following general formula (1) and structural units of formula (4), and is soluble in an organic solvent.

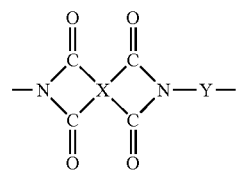
(1)

wherein X is a tetravalent organic group having 4 or more carbon atoms, none of the carbon atoms of X being bound to a plurality of carbonyl groups, and Y is a diamine residue of the general formula (2) or (3),

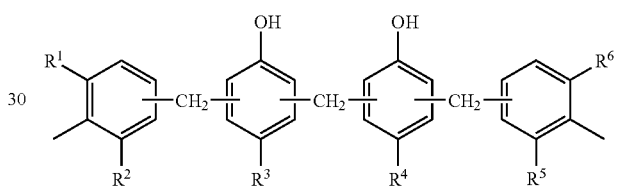
(2)

wherein each of $R^1$, $R^2$, $R^3$, $R^4$, $R^5$ and $R^6$ is independently selected from the group consisting of a hydrogen atom and alkyl groups having 1 to 6 carbon atoms,

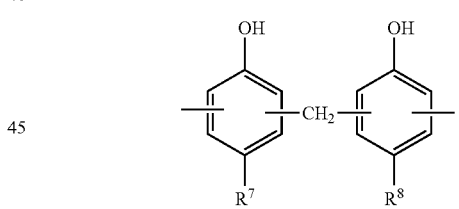
(3)

wherein each of $R^7$ and $R^8$ is independently selected from the group consisting of a hydrogen atom and alkyl groups having 1 to 6 carbon atoms;

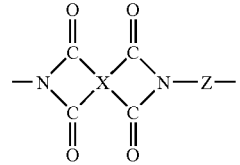
(4)

wherein X is a tetravalent organic group having 4 or more carbon atoms, none of the carbon atoms of X being bound to a plurality of carbonyl groups, and Z is a diamine residue of the general formula (5),

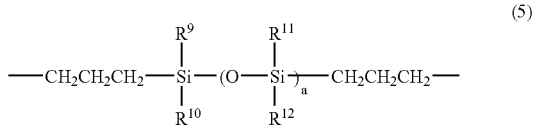

wherein each of $R^9$, $R^{10}$, $R^{11}$, and $R^{12}$ is independently selected from the group consisting of substituted or non-substituted monovalent hydrocarbon groups having 1 to 8 carbon atoms, and "a" is an integer of from 1 to 100.

To attain the object of the present invention, a polyimidesilicone resin is preferably used in which the amount of the diamine residues of the general formula (2) or (3) is from 5 mole % to 95 mole % and the amount of the diamine residue of the general formula (5) is from 95 mole % to 5mole %, based on the total amount of the diamine residues, and which has a transmittance, measured in a form of a film of 10 μm thickness on a glass substrate of 1 mm thickness, of 80% or higher in the wavelength region from400 nm to 700 nm. The present invention also provides a semiconductor device or a display apparatus which comprises the aforesaid polyimidesilicone resin.

DESCRIPTION OF THE PREFERRED EMBODIMENTS

Figure 1:
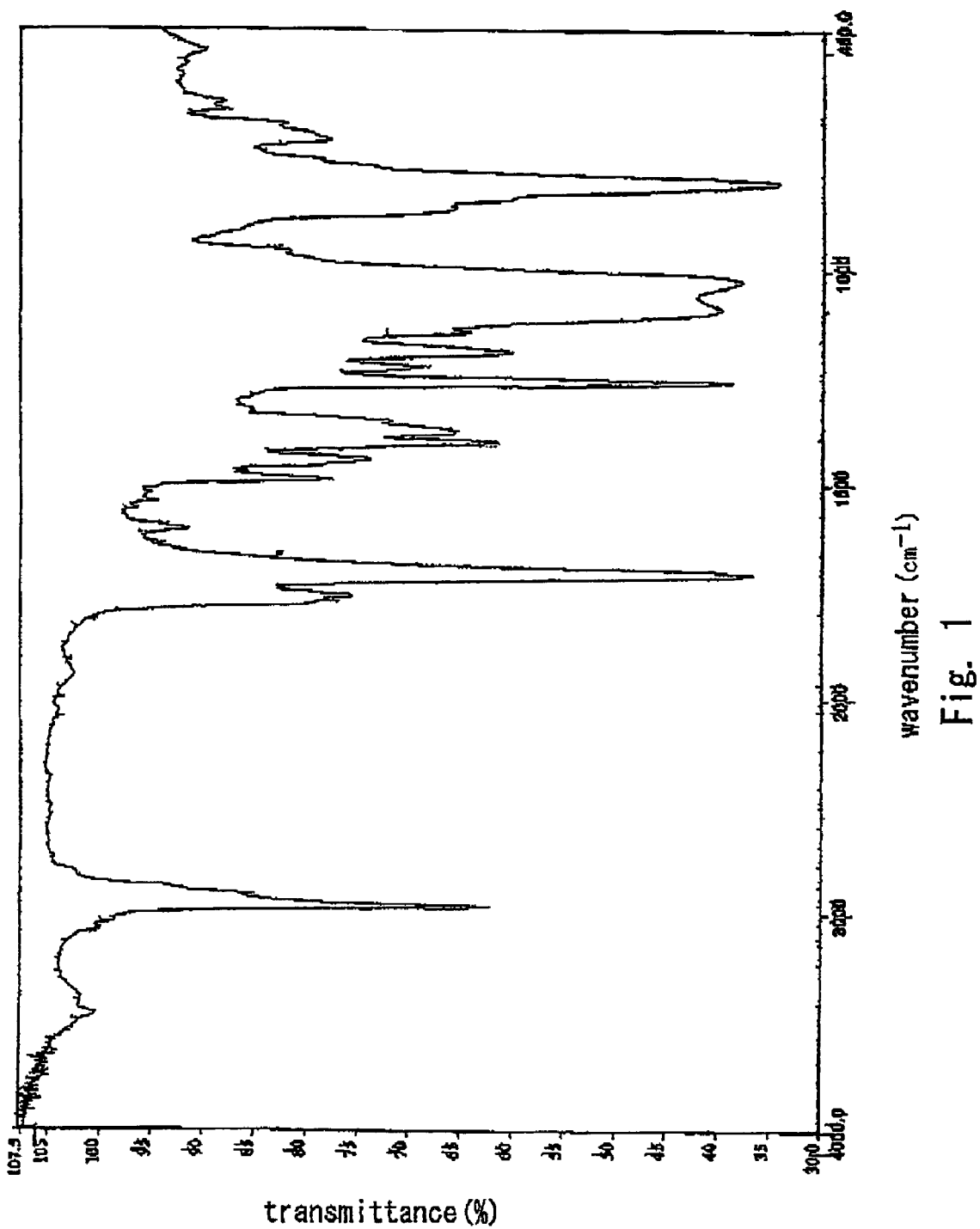
FIG. 1 shows an infrared absorption spectrum of the imidesilicone resin prepared in Example 1.

The present invention will be explained further in detail. The present polyimidesilicone resin is a reaction product of a tetracarboxylic dianhydride and a diamine, characterized in that the resin contains thermosetting groups, and is soluble in an organic solvent and transparent.

There are known thermosetting groups such as a carboxyl group, amino group, epoxy group, and hydroxyl group. In view of the production process of the present polyimide, a phenol group may be selected in the present invention, because it does not react easily with a carboxyl group or an amino group.

The diamine, a raw material for the present polyimidesilicone resin, will be explained below. In a preferred embodiment of the present invention, a diamine is used which has phenol groups in the diamine residue. For example, the one having a diamine residue of the general formula (2) or (3) is used in the present invention.

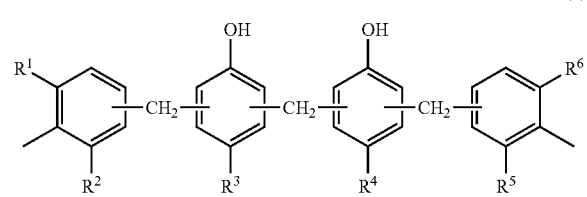

In the formula (2), each of $R^1$, $R^2$, $R^3$, $R^4$, $R^5$ and $R^6$ is independently selected from the group consisting of a hydrogen atom and alkyl groups having 1 to 6 carbon atoms. The examples of $R^1$, $R^2$, $R^3$, $R^4$, $R^5$ and $R^6$ include methyl, ethyl, propyl, butyl, pentyl, and hexyl group, among which methyl group is preferred.

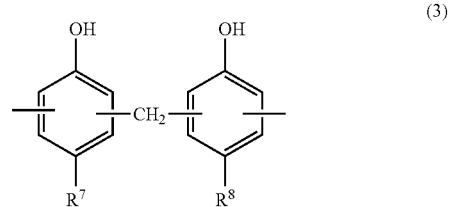

In the formula (3), each of $R^7$ and $R^8$ a is independently selected from the group consisting of a hydrogen atom and alkyl groups having 1 to 6 carbon atoms. The examples of $R^7$ and $R^8$ include methyl, ethyl, propyl, butyl, pentyl, and hexyl group, among which methyl group is preferred.

An amount of the diamine residue having phenol groups may be in the range of from 5 mole % to 95 mole %, preferably from 20 mole % to 80 mole %, based on the total amount of the diamine residues. If the amount is below 5 mole %, a film cured with a substance reactive with the phenol groups, such as an epoxy compound, may have a low density of crosslinkage, so that the film may not be sufficiently resistant to solvents. If the amount exceeds 95 mole %, an amount of diaminosiloxane is so small that solubility of the resultant polyimide resin in organic solvents is lower and adhesion of the cured film to a substrate is poorer.

In a preferred embodiment of the invention, a diamine further comprising a diaminosiloxane residue is used. An example of such a diamine is represented by the general formula (5).

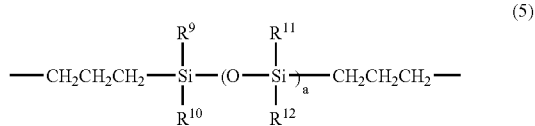

In the formula (5), each of $R^9$, $R^{10}$, $R^{11}$, and $R^{12}$ is independently selected from the group consisting of substituted or unsubstituted monovalent hydrocarbon groups having 1 to 8 carbon atoms, for example, alkyl groups such as methyl, ethyl, propyl, butyl, pentyl, and hexyl groups; alicyclic groups such as cyclopentyl and cyclohexyl groups; aryl groups such as phenyl and xylyl groups; aralkyl groups such as benzyl and phenetyl groups; halogenated alkyl groups such as 3,3,3-trifluoropropyl and 3-chloropropyl groups; trialkoxysilylalkyl groups such as 2-(trimethoxysilyl)ethyl group; alkoxy groups such as methoxy, ethoxy, and propoxy groups; aryloxy groups such as phenoxy group; and cyano group. Among these, ethyl and phenyl groups are preferred. In the formula (5), "a" is an integer of from 1 to 100.

An amount of the diaminosiloxane residue may range from 5 mole % to 95 mole %, preferably from 10 mole % to 90 mole %, based on the total amount of the diamine residues. If the amount is below 5 mole %, solubility of a resultant polyimidesilicone resin in organic acids is undesirably low. If the amount exceeds 95 mole %, the polyimidesilicone resin obtained is difficult to handle, and, due to a lower content of curable groups, the resin may not form a cured film having a good adhesion property. By using the diaminosiloxane, the solubility of the resin obtained in organic solvents and the adhesion property to a various kinds of substrates are improved.

In order to obtain the polyimidesilicone resin colorless and transparent in the visible light region, these diamines are preferably colorless and transparent.

In addition to the above diamines, any known diamines for a general use can be used together for preparing the present polyimidesilicon resin in such an amount that the colorlessness and transparency of the resin is not damaged. Examples of such diamines include aliphatic diamines such as tetrametylenediamine, 1,4-diaminocyclohexane, and 4,4'-diaminodicyclohexylmetahne; and aromatic diamines such as phenylenediamine, 4,4'-diaminodiphenylether, and 2,2-bis(4-aminophenyl) propane. These can be used alone or in a mixture of two or more of them.

The tetracarboxylic dianhydride, another raw material for the present polyimidesilicone resin, will be explained below. The present polyimidesilicone resin is characterized in that it is colorless and transparent in the visible light region. Accordingly, it is preferred that the tetracarboxylic dianhydride as a raw material for the resin is colorless and transparent, or forms a less amount of charge transfer complexes known to cause discoloration. Aliphatic tetracarboxylic dianhydrides and alicyclic tetracarboxylic dianhydrides are preferred because of their superior colorlessness and transparency. However, aromatic tetracarboxylic dianhydrides which have superior heat resistance may be used in such an amount that they db not cause discoloration.

Examples of the aliphatic tetracarboxylic dianhydrides include butane-2,3,4-tetracarboxylic dianhydride and pentane-1,2,4,5-tetracarboxylic dianhydride. Examples of the alicyclic tetracarboxylic dianhydrides include 1,2,3,4-cyclobutanetetracarboxylic dianhydride, cyclohexane-1,2,4,5-tetracarboxylic dianhydride, dicyclohexyl-3,4,3',4'-tetracarboxylic dianhydride, bicyclo[2.2.1]heptane-2,3,5,6-tetracarboxylic dianhydride, and 2,3,4,5-tetrahydrofurantetracarboxylic dianhydride. Examples of the aromatic tetracarboxylic dianhydrides include pyromellitic dianhydride, 3,3',4,4'-benzophenonetetracarboxylic dianhydride, 3,3',4,4'-diphenyl ether tetracarboxylic dianhydride, 4,4'-hexafluoropropylidenebisphthalic dianhydride, and 3,3',4,4'-diphenyl sulfone tetracarboxylic dianhydride. Aliphatic tetracarboxylic dianhydrides having an aromatic ring may be used, such as, for example, 3a,4,5,9b-tetrahydro-5-(tetrahydro-2,5-dioxo-3-furanyl)-naphtho[1,2-c]furan-1,3-dione, and 3a,4,5,9b-tetrahydro-5-methyl-5-(tetrahydro-2,5-dioxo-3-furanyl)-naphtho[1,2-c]furan-1,3-dione. These tetracarboxylic dianyhdrides may be used alone or in a mixture of two or more of them.

The present polyimidesilicone resin may be prepared in an one-step process in which diamine and tetracarboxylic dianhydride are reacted in approximately equimolar amounts in the presence of a solvent only at a high temperature, or in a two-step process in which a polyamic acid is prepared at a lower temperature in the first step and, then, the polyamic acid is imidized at a higher temperature.

A ratio of the diamine component to the tetracarboxylic dianhydride component is determined according to a desired molecular weight of the polyimidesilicone resin and so on. Typically, the molar ratio ranges from 0.95 to 1.05, preferably 0.98 to 1.02. To adjust a molecular weight of the polyimidesilicone resin, a mono-functional raw material such as phthalic anhydride and aniline can be used. The amount of the mono-functional raw material is preferably 2 mole % or lower based on the total amount of the mono- and di-functional raw materials.

In the one-step process, a reaction temperature ranges from 150 to 300 degrees C., and a reaction time ranges from 1 to 15 hours. In the two-step process, the polyamic acid preparation is performed at a temperature of from 0 to 1.20 degrees C. for 1 to 100 hours and, then, the imidization process is performed at a temperature of from 0 to 300 degrees C. for 1 to 15 hours.

In the preparation process, any solvent can be used which is miscible with the raw materials, i.e., the diamine and the tetracarboxylic anhydride, and the reaction product, i.e., the polyimidesilicone. Examples of such a solvent include phenols such as phenol, 4-methoxyphenol, 2,6-dimethylphenol, and m-cresol; ethers such as tetrahydrofuran and anisole; ketones such as cyclohexanone, 2-butanone, methyl isobutyl ketone, 2-heptanone, 2-octanone, and acetophenone; ethers such as butyl acetate, methyl benzoate, and γ-butyrolactone; cellosolves such as butylcellosolve acetate, and propylene glycol monomethyl ether acetate, amides such as N,N-dimethylformamide, N,N-dimethylacetoamide, and N-methyl-2-pyrrolidone.

Together with the aforesaid solvent, aromatic hydrocarbons such as toluene and xylene can be used to make an azeotrope with water produced in the imidization process to thereby remove the water with ease. These solvents can be used alone or in a mixture of two or more of them.

When plural species of at least one of the diamine and the carboxylic dianhydride is used, there is not added any particular limitation on the process. Use is made of, for instance, a method in which all of the raw materials are mixed together in advance and polycondensed simultaneously, and a method in which each of two or more diamines of tetracarboxylic anhydrides is added sequentially to react separately.

In the imidization process, a dehydrating agent and an imidization catalyst may be added to the reaction mixture and, if needed, heated. Examples of the dehydrating agent include acid anhydrides such as acetic anhydride, propionic anhydride, and trifluoroacetic anhydride. Preferably, the dehydrating agent is added in an amount of from 1 to 10 moles per mole of the diamine.

Examples of the imidization catalyst include tertiary amines such as pyridine, corydine, lutidine, and triethylamine. The imidization catalyst is added preferably in an amount of from 0.5 to 10 moles per mole of the dehydrating agent.

The present polyimidesilicone resin has excellent solubility, so that it can be dissolved in an organic solvent to provide a solution with a viscosity suited to be applied on a specific substrate.

A solvent to dissolve the present polyimidesilicone resin may be those which can be used in the preparation processes, or other aromatic hydrocarbon solvents and ketone solvents, as far as these can dissolve the present polyimidesilicone.

Particularly, when it is desired to dissolve the polyimidesilicone in an aromatic hydrocarbon or ketone solvent having a low boiling point, synthesized polyimidesilicone resin is purified by, for example, reprecipitation with a poor solvent, and then can be re-dissolved in such a solvent.

The present polyimidesilicone resin can be applied on any substrate, e.g. metals such as iron, copper, nickel, and aluminum; inorganic substrates such as glass; and organic resins such as epoxy resin and acrylic resins.

The thermosetting property of the present polyimidesilicone can be improved, by adding a substance reactive with the phenol groups of the polyimidesilicone resin. Examples of such a substance include polyfunctional organic substances, e.g., resins and oligomers having a plurality of functional groups reactive with a phenol group, such as carboxyl, amino, and epoxy groups.

After cured by heating, the present polyimidesilicone resin shows excellent heat resistance, mechanical strength, solvent resistance, and adhesion to a various kinds of substrates.

The curing conditions are not limited to particular ones. Typically, a curing temperature ranges from 80 to 300 degrees C., preferably from 100 to 250 degrees C. If the temperature is below 80 degrees C., an impractically long time is required for curing or the cured film would have low storage stability. Unlike the conventional polyamic acid solution, the present polyimidesilicone resin may not require a long curing at a temperature so high as above 300 degrees C., so that thermal degradation of a substrate can be prevented.

The present polyimidesilicone resin is characterized by a transmittance of 80% or higher in the visible wave length region of from 400 nm to 700 nm when measured in a form of a film of 10 μm thickness on a 1-mm thick glass substrate by UV/Visible absorption spectrometry.

The present highly transparent, thermosetting polyimidesilicone soluble in solvents can be used for protective films for color filters, light emitting diodes, and laser diodes in semiconductor devices; alignment layers for liquid crystals of liquid crystal displays; and in various kinds of electronic or optical apparatuses.

EXAMPLES

Example 1

Synthesis of a Polyimidesilicone Resin

In a flask provided with a stirrer, a thermometer, and nitrogen purge equipment, 30.0 g, i.e., 0.1 mole, of 3a,4,5,9b-tetrahydxo-5-(tetrahydro-2,5-dioxo-3-furanyl)-naphtho[1,2-c]furan-1,3-dione, and 250 g of N,N-dimethylacetamide were fed and mixed to dissolve. To the solution, 17.3 g, i.e., 0.035 mole, of 2,2'-methylenebis[6-(4-amino-3,5-dimethylbenzyl)-4-methyl]phenol was added. The reaction mixture was kept at 50 degrees C. for 3 hours. Then, 56.2 g, i.e. 0.065 mole, of diaminosiloxane of the general formula (5), where "a" is 9.5 on average, was added drop wise at room temperature. After the addition was completed, the reaction mixture was stirred at room temperature for 12 hours.

Subsequently, a reflux condenser provided with a water receptor was attached to the flask and, then, 50 g of toluene was added. After the temperature was raised to 170 degrees C. and kept at that temperature for 6 hours, an almost clear solution was obtained.

The solution thus obtained was put in methanol, a poor solvent, to thereby precipitate. FIG. 1 shows an infrared absorption spectrum of the resin. There was not a peak, based on the polyamic acid, which indicates the presence of unreacted functional groups, and the absorption bands of imide group were observed at 1770 cm$^{-1}$ and 1710 cm$^{-1}$. The resin obtained had the structure of the formula (I) having the two repeating units.

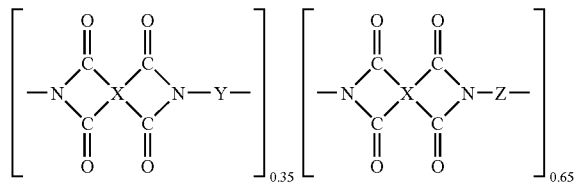

wherein, X is

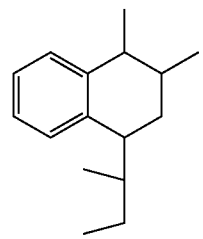

Y is

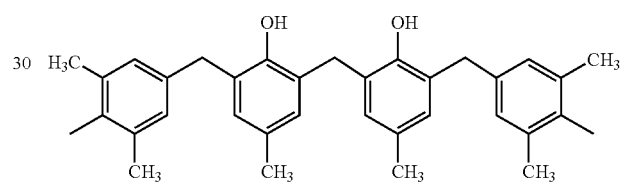

and Z is

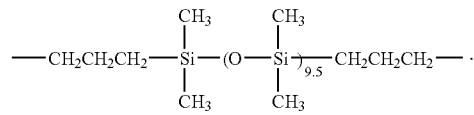

Figure 2:
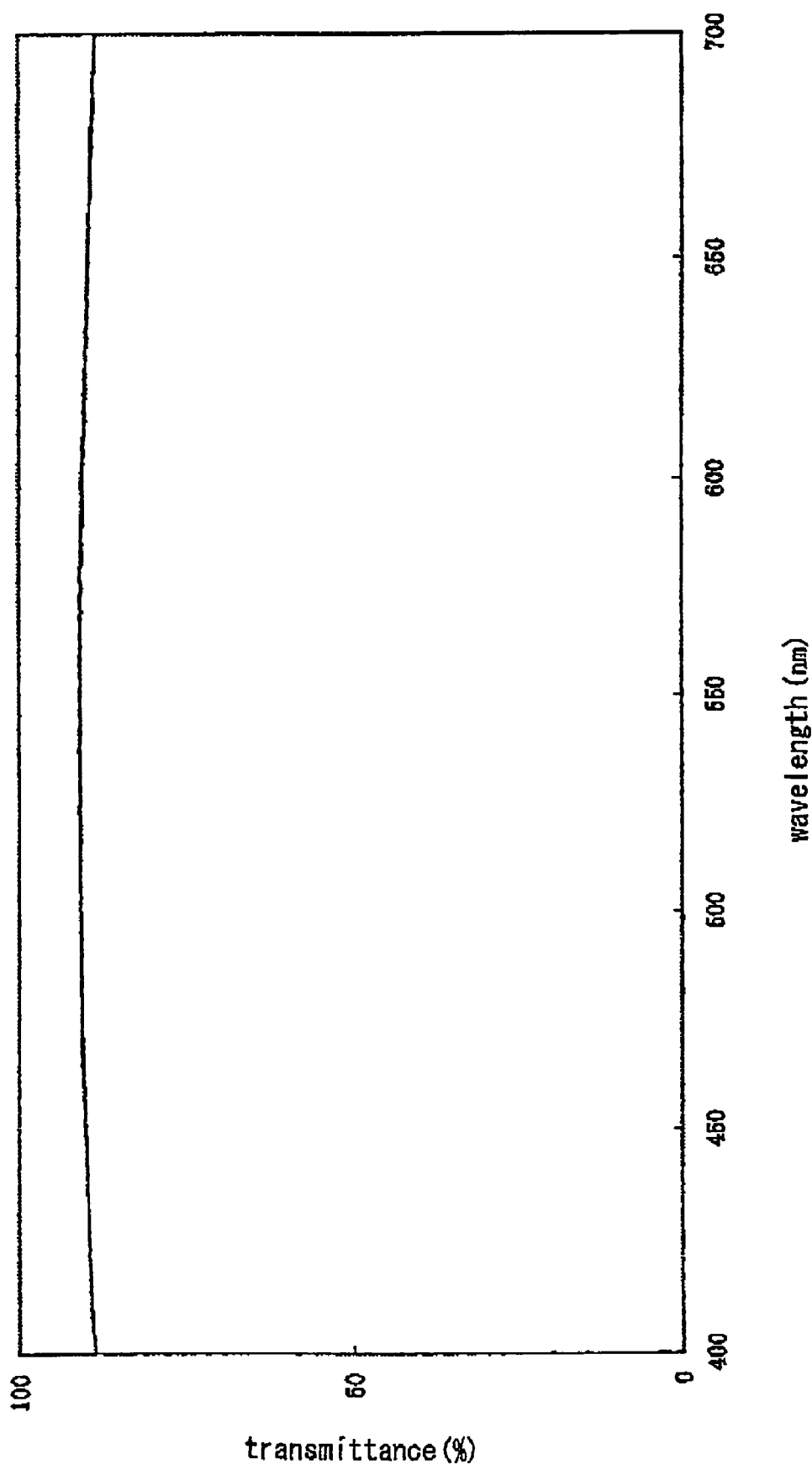
FIG. 2 shows a transmission spectrum of the imidesilicone resin prepared in Example 1.

A weight average molecular weight of the resin, reduced to polystyrene, was 11,000, which was determined by gel permeation chromatography (GPC) using tetrahydrofuran as a solvent. A film of 70 μm thickness was made by applying a methyl isobutyl ketone solution of the resin on a glass substrate with dimensions of 25 mm by 75 mm and a thickness of 1 mm, and drying the applied film. FIG. 2 shows a transmission spectrum of the film on the glass substrate. The transmittance at the wavelength of from 400 nm to 700 nm was 80% or higher, while that of the blank transmittance of the glass substrate ranges from 88 to 90%.

Example 2

Synthesis of a Polyimidesilicone Resin

In a flask provided with a stirrer, a thermometer, and nitrogen purge equipment, 30.0 g, i.e., 0.1 mole, of 3a,4,5,9b-tetrahydro-5-(tetrahydro-2,5-dioxo-3-furanyl)-naphtho[1,2-c]furan-1,3-dione, and 250 g of N,N-dimethylacetamide were fed and mixed to dissolve. To the solution, 34.6 g, i.e., 0.07 mole, of 2,2'-methylenebis[6-(4-amino-3,5-dimethylbenzyl)-4-methyl]phenol was added. The reaction mixture was kept at 50 degrees C. for 3 hours. Then, 26 g, i.e. 0.03 mole, of diaminosiloxane of the general formula (5), where "a" is 9.5 on average, was added drop wise a room temperature. After the addition was completed, the reaction mixture was stirred at room temperature for 12 hours.

Subsequently, a reflux condenser provided with a water receptor was attached to the flask and, then, 50 g of toluene was added. After the temperature was raised to 170 degrees C. and kept at that temperature for 6 hours, an almost clear solution was obtained.

The solution thus obtained was put in methanol, a poor solvent, to thereby precipitate. In an infrared absorption spectrum of the resin, there was not a peak, based on the polyamic acid, which indicates the presence of unreacted functional groups, and the absorption bands of imide group were observed at 1770 cm$^{-1}$ and 1710 cm$^{-1}$. The resin obtained had the structure of the formula (II) having the two repeating units.

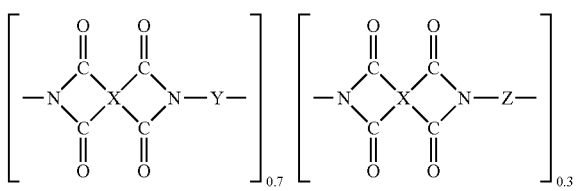

wherein, X is

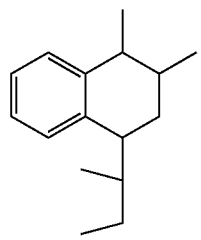

Y is

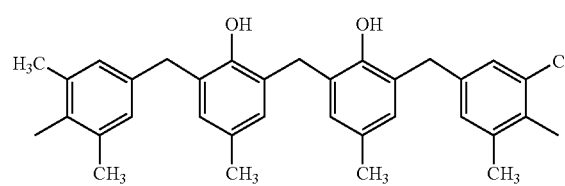

and Z is

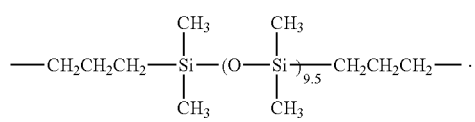

A weight average molecular weight of the resin, reduced to polystyrene, was 7,000, which was determined by gel permeation chromatography (GPC) using tetrahydrofuran as a solvent. A film of 30 μm thickness was made by applying a methyl isobutyl ketone solution of the resin on a 1-mm thick glass substrate and drying the applied film. The film on the glass substrate had a transmittance of 80% or higher at the wavelength of from 400 nm to 700 nm.

Example 3

Synthesis of a Polyimidesilicone Resin

In a flask provided with a stirrer, a thermometer, and nitrogen purge equipment, 30.0 g, i.e., 0.1 mole, of 3a,4,5,9b-tetrahydro-5-(tetrahydro-2,5-dioxo-3-furanyl)-naphtho[1,2-c]furan-1,3-dione, 250 g of N,N-dimethylacetamide and 100 g of toluene were fed and mixed to dissolve. To the solution, 12.35 g, i.e., 0.025 mole, of 2,2'-methylenebis[6-(4-amino-3,5-dimethylbenzyl)-4-methyl]phenol was added. The reaction mixture was kept at 50 degrees C. for 3 hours. Then, 64.88 g, i.e., 0.075 mole of diaminosiloxane of the general formula (5), where "a" is 9.5 on average, was added drop wise at room temperature. After the addition was completed, the reaction mixture was stirred at room temperature for 12 hours.

Subsequently, a reflux condenser provided with a water receptor was attached to the flask and, then, 20.4 g of acetic anhydrous and 26.4 g of pyridine were added. The temperature was raised to 50 degrees C. and kept at that temperature for 3 hours.

The solution thus obtained was put in methanol, a poor solvent, to thereby precipitate. In an infrared absorption spectrum of the resin, there was not a peak, based on the polyamic acid, which indicates the presence of unreacted functional groups, and the absorption bands of imide group were observed at 1770 cm$^{-1}$ and 1710 cm$^{-1}$. The resin obtained had the structure of the formula (III) having the two repeating units.

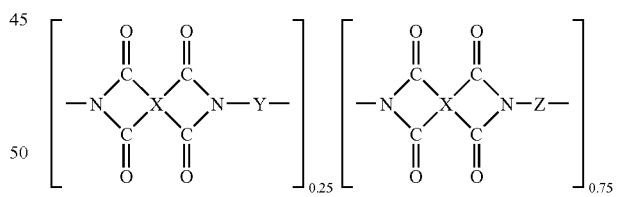

wherein, X is

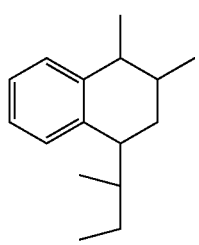

Y is

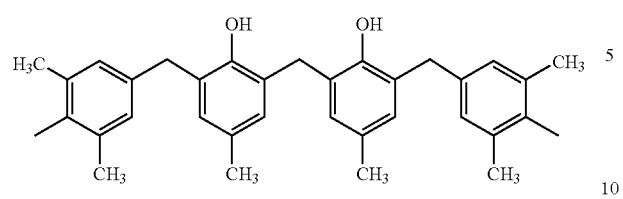

and Z is

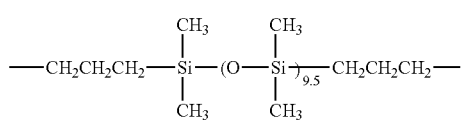

A weight average molecular weight of the resin, reduced to polystyrene, was 24,000 which was determined by gel permeation chromatography (GPC) using tetrahydrofuran as a solvent. A film of 50 μm thickness was made by applying a methyl isobutyl ketone solution of the resin on a 1-mm thick glass substrate and drying the coating film. The film on the glass had a transmittance of 80% or higher at the wavelength of from 400 nm to 700 nm.

Example 4

Evaluation of the Cured Resin

To 100 parts by weight of the polyimidesilicone resin prepared in Example 1, 10 parts by weight of an epoxy, N,N-diglycidyl-4-glycidyloxyaniline, was added and the mixture was dissolved in methyl isobutyl ketone. The methyl isobutyl ketone solution obtained was applied on a copper plate with a bar coater and the applied film was cured at 150 degrees C. for 2 hours. The cured film was aged in an environment of 85 degrees C. and 85% RH for a week. The film did not peel off and the copper plate did not rust. Then, the cured film was soaked in methyl ethyl ketone for 5 minutes. The surface of the film was not damaged at all.

INDUSTRIAL APPLICABILITY

The present thermosetting polyimidesilicone resin is transparent and soluble in solvents. It can be cured at a relatively low temperature for a short period of time. The cured film has excellent heat resistance, mechanical strength, solvent resistance, and adhesion to a various kinds of substrates. It is advantageously used for protective films for color filters, light emitting diodes, and laser diodes in semiconductor devices; alignment layers for liquid crystals in liquid crystal displays; and in various kinds of electronic or optical apparatuses.

What is claimed is:
1. A colorless and transparent thermosetting polyimide-silicone resin comprising structural units of the following general formula (1) and structural units of the general formula (4), said resin being soluble in an organic solvent

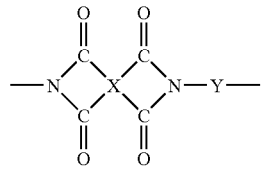

wherein X is a tetravalent organic group having 4 or more carbon atoms, none of the carbon atoms of X being bound to a plurality of carbonyl groups, said tetravalent organic group being derived from the group consisting of aliphatic tetracarboxylic dianhydrides and alicyclic tetracarboxylic dianhydrides, and Y is a diamine residue of the general formula (2) or (3),

wherein each of $R^1$, $R^2$, $R^3$, $R^4$, $R^5$ and $R^6$ is independently selected from the group consisting of a hydrogen atom and alkyl groups having 1 to 6 carbon atoms,

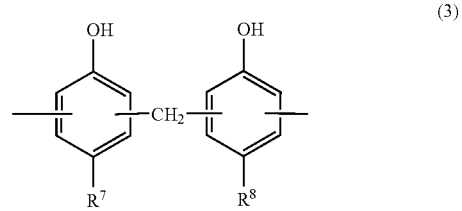

wherein each of $R^7$ and $R^8$ is independently selected from the group consisting of a hydrogen atom and alkyl groups having 1 to 6 carbon atoms;

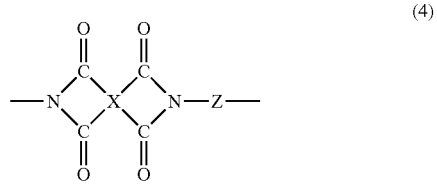

wherein X is a tetravalent organic group having 4 or more carbon atoms, none of the carbon atoms of X being bound to a plurality of carbonyl groups, said tetravalent organic group being derived from the group consisting of aliphatic tetracarboxylic dianhydrides and alicyclic tetracarboxylic dianhydrides, and Z is a diamine residue of the general formula (5),

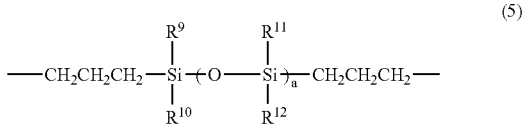

wherein each of $R^9$, $R^{10}$, $R^{11}$, and $R^{12}$ is independently selected from the group consisting of substituted or unsubstituted monovalent hydrocarbon groups having 1 to 8 carbon atoms, and "a" is an integer of from 1 to 100, wherein said thermosetting polyimidesilicone resin is colorless and transparent so that said thermosetting polyimidesilicone resin has a transmittance of 80% or higher in the wavelength region of from 400 nm to 700 nm, measured in a form of a film of 10 μm thickness on a glass substrate 1 mm in thickness.

2. The polyimidesilicone resin according to claim 1, wherein an amount of the diamine residue of the general formula (2) or (3) ranges from 5 mole % to 95 mole % and an amount of the diamine residue of the general formula (5) ranges from 5 mole % to 95 mile %, based on the total amount of the diamine residues.

3. A semiconductor device or a display apparatus which comprises polyimidesilicone resin according to claim 1.

4. A semiconductor device or a display apparatus which comprises polyimidesilicone resin according to claim 2.

5. The polyimidesilicone resin according to claim 1, wherein said tetravalent organic group is derived from the group consisting of butane-1,2,3,4-tetracarboxylic dianhydride, pentane-1,2,4,5-tetracarboxylic dianhydride, 1,2,3,4-cyclobutanetetracarboxylic dianhydride, cyclohexane-1,2,4,5-tetracarboxylic dianhydride, dicyclohexyl-3,4,3',4'-tetracarboxylic dianhydride, bicyclo[2.2.1]heptane-2,3,5,6-tetracarboxylic dianhydride, and 2,3,4,5-tetrahydrofurantetracarboxylic dianhydride.

6. The polyimidesilicone resin according to claim 1, prepared by reacting 3a,4,5,9b-tetrahydro-5-(tetrahydro-2,5-dioxo-3-furanyl)-naphto[1,2-c]furan-1,3-dione with 2,2'-methylenebis[6-(4-amino-3,5-dimethylbenzyl)-4-methyl]phenol and then with a diaminosiloxane of the general formula (5) wherein "a" is 9.5 on average.

7. The polyimidesilicone resin according to claim 2, prepared by reacting 3a,4,5,9b-tetrahydro-5-(tetrahydro-2,5-dioxo-3-furanyl)-naphto[1,2-c]furan-1,3-dione with 2,2'-methylenebis[6-(4-amino-3,5-dimethylbenzyl)-4-methyl]phenol and then with a diaminosiloxane of the general formula (5) wherein "a" is 9.5 on average.

* * * * *